United States Patent
Rösner et al.

(10) Patent No.: US 6,614,069 B2
(45) Date of Patent: Sep. 2, 2003

(54) NONVOLATILE SEMICONDUCTOR MEMORY CELL AND METHOD FOR FABRICATING THE MEMORY CELL

(75) Inventors: Wolfgang Rösner, Ottobrunn (DE); Thomas Schulz, München (DE); Lothar Risch, Neubiberg (DE); Ties Ramcke, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/054,440

(22) Filed: Jan. 22, 2002

(65) Prior Publication Data

US 2002/0125525 A1 Sep. 12, 2002

Related U.S. Application Data

(63) Continuation of application No. PCT/DE00/01732, filed on May 29, 2000.

(30) Foreign Application Priority Data

Jul. 20, 1999 (DE) .......................... 199 33 958

(51) Int. Cl.[7] .............................. H01L 29/788
(52) U.S. Cl. .................. 257/315; 257/321; 257/324
(58) Field of Search ........................ 257/315, 321, 257/324; 437/52, 60

(56) References Cited

U.S. PATENT DOCUMENTS 5,498,562 A * 3/1996 Dennison et al. ........... 438/253
5,563,089 A * 10/1996 Jost et al. ................... 438/396
5,714,766 A    2/1998 Chen et al.
5,866,453 A *  2/1999 Prall et al. ................. 438/253
5,871,870 A    2/1999 Alwan
5,905,273 A    5/1999 Hase et al.
5,952,692 A *  9/1999 Nakazato et al. ........... 257/321

FOREIGN PATENT DOCUMENTS

DE    196 32 835 C1    4/1998
EP    0 843 360 A1     5/1998
EP    0 843 361 A1     5/1998

OTHER PUBLICATIONS

Mizuta, H. et al.: "High–speed single–electron memory: cell design and architecture", IEEE, 1998, pp. 67–72.
Fukuda, H. et al.: "Fabrication of silicon nanopillars containing polycrystalline silicon/insulator multilayer structures", Appl. Phys. Lett., Jan. 20, 1997, pp. 333–335.
Nakazato, K. et al.: "PLED—Planar localized electron devices", IEEE, 1997, pp. 7.7.1–7.7.4.

* cited by examiner

Primary Examiner—David Nelms
Assistant Examiner—Dao H. Nguyen
(74) Attorney, Agent, or Firm—Laurence A. Greenberg; Werner H. Stemer; Ralph E. Locher

(57) ABSTRACT

A nonvolatile semiconductor memory cell includes a transistor component formed on a substrate and a storage node that determines the switching state of the transistor component. The storage node is arranged near a control gate electrode. The storage node has a group of vertically oriented column structures having at least two semiconductor layer zones and an insulating layer zone situated between the two semiconductor layer zones.

12 Claims, 4 Drawing Sheets

NONVOLATILE SEMICONDUCTOR MEMORY CELL AND METHOD FOR FABRICATING THE MEMORY CELL

CROSS-REFERENCE TO RELATED APPLICATION

This application is a continuation of copending International Application PCT/DE00/01732, filed May 29, 2000, which designated the United States.

BACKGROUND OF THE INVENTION

Field of the Invention

The invention relates to a nonvolatile semiconductor memory cell and to a method for fabricating the memory cell.

Erasable read-only memories, "Flash EPROMs" (Erasable Programmable Read-Only Memories) and EEPROMs (Electrically Erasable Programmable Read-Only Memories) are known and are used as nonvolatile memory elements in a wide variety of areas of technology. Flash EPROMs and EEPROMs include a multiplicity of nonvolatile semiconductor memory cells which each include one or two transistors. The nonvolatile semiconductor memory cell is programmed by reversing the electrical charge on a floating gate, which can be carried out in various ways, depending on the design of the memory cell. The charge state of the floating gate which results from the charge reversal is conserved for a long time (a number of years).

Many applications require erasable read-only memories with short programming times and with long charge retention times. In addition, memory cells with two transistors have the drawback that they take up a relatively large amount of space.

Published European Patent Application EP 0 843 361 A1 discloses a memory component with a storage node that is arranged above a channel region of a transistor. A single layer stack having a square horizontal cross section and serving as a tunnel barrier structure is arranged over the storage node. The barrier structure, referred to as a "multiple tunnel junction", has an alternating insulating layer and a conduction layer, the respective extent of which covers the entire channel region of a transistor. Alternatively, the conduction layer may be formed such that it has small conduction islands. A control electrode in the form of a word line is arranged on the layer stack. Charge is injected into the layer stack via the control electrode.

Another memory component in which a similar layer stack is formed over a channel region of a transistor and which likewise serves as a tunnel barrier layer is known from U.S. patent application Ser. No. 5,714,766.

The publication by H. Mizuta et al.: "High-speed single-electron memory: cell design and architecture" IEEE Comput. Soc., 12th–13th, March 1998, pp. 67–72, XP002151823 Los Alamitos/USA discloses a RAM memory component in which a stack structure used as a barrier system is formed above a storage node. The storage node is formed horizontally between a drain and a source region of a transistor. A word line is arranged on the stack structure, and via the word line, charges are injected into the layer stack which tunnel through the layer stack. In addition, the stack is surrounded by a trimming gate electrode that can be used to influence the tunneling of the charge carriers.

The publication "PLED—Planar Localized Electron Devices" by K. Nakazato, et al., IEDM 97–179, (1997) describes a semiconductor memory cell in which the floating gate electrode of an MOS (Metal Oxide Semiconductor) transistor is connected to a data line via a layer stack including alternate polysilicon and silicon nitride layers. The layer stack is bordered by a control gate electrode that can be used to alter the electrical potential in the peripheral area of the layer stack. Both the floating gate electrode and the control gate electrode are connected to a word line. By suitably driving the word line, the floating gate electrode can be connected to the data line and the charge on the floating gate electrode can be reversed. On the other hand, the insulating barriers (silicon nitride layers) of the layer stack result in a relatively long retention time for the charge if the gate voltage is not in line with the write or programming mode.

Published German Patent Application DE 196 32 835 A1 describes a semiconductor capacitor that has a capacitor electrode with a multiplicity of column structures to increase the size of the capacitor surface. The column structures are formed using a random mask that permits structure sizes in the sub-100 nm range.

SUMMARY OF THE INVENTION

Fit is accordingly an object of the invention to provide a nonvolatile semiconductor memory cell and a method for producing the memory cell which overcome the above-mentioned disadvantages Of the prior art apparatus and methods of this general type.

In particular, it is an object of the invention to provide a nonvolatile semiconductor memory cell that is suitable for constructing large-scale integrated semiconductor memories and that also has a high ratio of storage time to programming time.

With the foregoing and other objects in view there is provided, in accordance with the invention, a nonvolatile semiconductor memory cell that includes: a substrate; a transistor component formed on the substrate; a control gate electrode; and a storage node that determines the switching state of the transistor component. The storage node is located near the control gate electrode. The storage node includes a group of a plurality of vertically oriented column structures. Each one of the vertically oriented column structures has at least two semiconductor layer zones and an insulating layer zone that is configured between the two semiconductor layer zones.

In accordance with an added feature of the invention, the transistor component includes a channel region; and the plurality of the vertically oriented column structures are randomly distributed above the channel region.

In accordance with an additional feature of the invention, a plurality of insulating layer zones are provided; the at least two semiconductor layer zones define a plurality of semiconductor layer zones. The insulating layer zone forms one of the plurality of the insulating layer zones; and the plurality of semiconductor layer zones and the plurality of the insulating layer zones are alternately configured.

In accordance with another feature of the invention, the control gate electrode at least partly surrounds each one of the plurality of the vertically oriented column structures of the storage node.

In accordance with a further feature of the invention, the transistor component has a floating gate electrode; and the storage node is capacitively coupled to the floating gate electrode.

In accordance with a further added feature of the invention, the transistor component has a floating gate electrode; and the storage node coupled to the floating gate electrode by an electrically conductive connection.

In accordance with a further additional feature of the invention, the storage node forms a gate electrode of the transistor component.

In accordance with yet an added feature of the invention, each one of the plurality of the vertically oriented column structures has a diameter of less than 50 nm, and preferably of less than 30 nm.

In accordance with yet another feature of the invention, the two semiconductor layer zones have an axial thickness of less than 10 nm, and preferably of less than 3 nm.

By using a plurality of column structures having at least one respective insulating layer zone acting as a charge barrier at the storage node, it is possible to obtain a semiconductor memory cell that has a long storage time. The storage time corresponds to a characteristic time during which charge (in the read mode) flows away from the storage node, i.e. in which the storage node is automatically discharged to the extent that the switching state of the transistor component is redefined and hence the information stored in the semiconductor memory cell is lost.

Advantageously, the column structures are randomly distributed in the area above the channel region of the transistor component. Such a structure can be produced inexpensively independently of lithography.

One advantageous feature of the invention is that each of the column structures includes a plurality of semiconductor layer zones and insulating layer zones arranged alternately. This means that the charge stored in the bottommost semiconductor layer zone is held there even more effectively and consequently the storage time is extended.

Preferably, each column structure of the storage node is at least partly surrounded by the control gate electrode. This permits extremely effective punch-through of the potential on the control gate electrode through the entire column structure group, since the individual column structures are surrounded on all sides by the control gate electrode. Changing the gate potential shifts the energy level of the conduction band in the insulating layer zone(s) and in the adjoining semiconductor layer zones, which means that charge transfer can take place over the energy barrier(s) caused by the insulating layer zone(s) and possibly—if the thickness of the insulating layer(s) is small enough—even through it ("tunneling"). As a result, the programming time is shortened considerably.

In a first preferred embodiment of the invention, the transistor component has a floating gate electrode, and the storage node is connected to the floating gate electrode either by an electrically conductive connection or capacitively. In both cases, as in the case of a conventional memory cell, the threshold voltage of the transistor component is shifted.

In a second preferred embodiment of the invention, the storage node itself forms the gate electrode of the transistor component. In this case, the floating gate electrode is dispensed with between the channel region of the transistor component and the storage node, i.e. the field produced by the charges stored in the column structures has a direct effect on the channel region of the transistor component. This semiconductor memory cell is of more compact design than in the case of the first embodiment.

Preferably, the column structures have a diameter of less than 50 nm, in particular of less than 30 nm.

By suitably reducing the lateral and axial dimensions of the semiconductor layer zones, the individual semiconductor layer zones can each have a very small capacitance. The effect achieved by this is that the potential barriers produced by the insulating layer zones are increased by the Coulomb blockade, i.e. the electrical conduction in the column structures can be produced by single-electron charge transfers.

With the foregoing and other objects in view there is provided, in accordance with the invention, a method for fabricating a nonvolatile semiconductor memory cell, which includes steps of: forming transistor component having a source region, a channel region, and a drain region in a substrate; producing a channel insulating layer over the channel region; producing a layer sequence above the channel insulating layer; producing the layer sequence with at least two semiconductor layer zones and with an insulating layer configured between the two semiconductor layer zones; using a random mask to form a group of vertical column structures from the layer sequence; and forming a control electrode by depositing an electrically conductive material near the group of the column structures.

In accordance with an added mode of the invention, the step of forming the control electrode is performed by depositing the electrically conductive material between the individual column structures.

In accordance with an additional mode of the invention, the semiconductor layer zones are produced from silicon; and after forming the column structures, a lateral, self-limiting oxidation step is performed such that silicon column structures are produced which have reduced lateral dimensions with respect to the column structures that existed prior to the oxidation step.

In accordance with a concomitant mode of the invention, a layer, which includes an electrically conductive material, and a further insulating layer are deposited between the channel insulating layer and the layer sequence; and a structuring step is performed to form a floating gate electrode from the layer that includes the electrically conductive material such that the floating gate electrode is insulated on all sides.

A fundamental advantage of the inventive method is that the column structures are produced independently of lithography using a random mask, and also, only conventional process steps are required to produce the remainder of the nonvolatile semiconductor memory cell.

Other features which are considered as characteristic for the invention are set forth in the appended claims.

Although the invention is illustrated and described herein as embodied in a nonvolatile semiconductor memory cell and method for fabricating same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
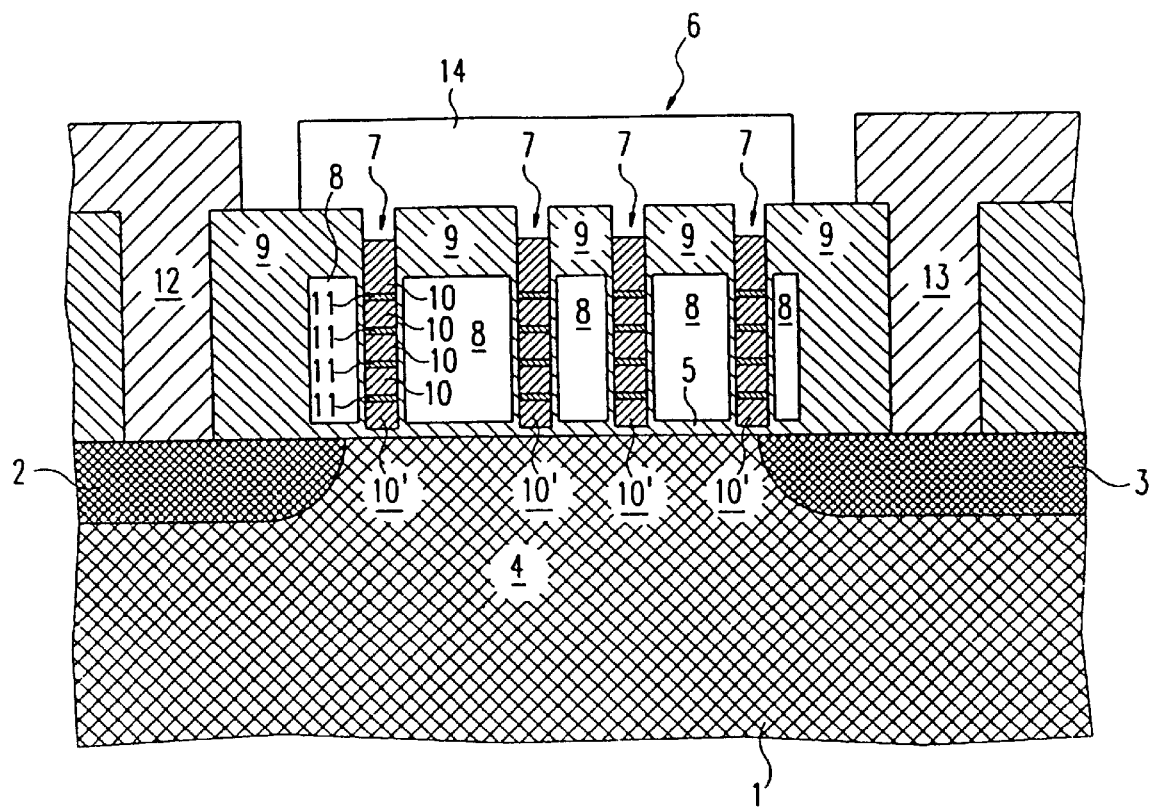
FIG. 1 is sectional illustration showing an inventive nonvolatile semiconductor memory cell.

Referring now to the figures of the drawing in detail and first, particularly, to FIG. 1 thereof, there is shown a substrate 1, which is for example a p-doped Si substrate. An n+-doped source region 2 and an n+-doped drain region 3 are formed in a customary well shape in the substrate 1. A substrate region 4 is situated between the source region 2 and the drain region 3. The channel region of the transistor component 2, 3, 4 is formed by the portion of the substrate region 4 that is close to the surface. A thin gate electrode insulating layer 5, which can be formed from $SiO_2$, for example, extends above the substrate region 4.

A gate electrode 6 is arranged above the gate electrode insulating and controls the conduction of current in the channel region using the known field effect. It includes a plurality of vertically oriented column structures 7 and a control gate electrode 8, which are electrically isolated from one another by electrically insulating material regions 9. In this context, the individual column structures 7 are embedded into the control gate electrode 8, so to speak, i.e. each column structure 7 is surrounded on all sides by the control gate electrode 8, and in this context, a peripheral region of the control gate electrode 8 also surrounds the entire group of column structures 7.

Each column structure 7 includes alternately arranged semiconductor layer zones 10 and insulating layer zones 11. The semiconductor layer zones 10 may be, for example, silicon (amorphous, polycrystalline or crystalline). The insulating layer zones 11 can be produced by thin nitride layers ($Si_3N_4$). The terminal layer zones, facing the channel region, of the column structures 7 are semiconductor layer zones 10'.

The individual column structures 7 may have a diameter of below 100 nm, preferably below 30 nm. The insulating layers 11 need to be thin enough (approximately 1 to 10 nm) to permit charge transfer. If the thickness of the insulating layers 11 is very small, the charge transfer may be effected by tunneling processes, and if (as illustrated) there are a plurality of insulating layers 11, each individual column structure 7 in this case produces a multiple tunnel connection, also referred to as MTJ (multiple tunnel junctions).

The layer thicknesses of the semiconductor layer zones 10 may also be chosen to be very small and may possibly be reduced to approximately 2 nm. In addition, an additional, lateral oxidation process can be used to laterally reduce the semiconductor layer zones 10 to have diameter values of approximately 2 nm, as is explained in more detail in conjunction with FIGS. 4A, 4B. Reducing the dimensions causes charge carrier localization, which results in level splitting for the electronic states, and finally, in the Coulomb blockade known for single-electron components, which allows specific transport of single electrons from one semiconductor layer zone 10 to the next. The electrons finally reach the terminal semiconductor layer zones 10', from which point they can no longer be forwarded and—in the semiconductor memory cell shown in FIG. 1—have a direct effect on the channel region of the transistor component 2, 3, 4 through the gate electrode insulating layer 5.

Electrical contact with the source region 2 and the drain region 3 is made via metal contact areas 12 and 13, respectively. To make shared electrical contact with the column structure group 7, a metal data line contact 14 is attached via the gate electrode 6.

In a manner that is not shown, a floating gate electrode FG (floating gate) can be arranged above the channel region and below the column structures 7. The floating gate electrode FG is from the channel region by a thin insulating layer (corresponding to the gate electrode insulating layer 5 in FIG. 1) and is either directly electrically conductively connected to the bottommost semiconductor layer zones 10' of the column structures 7 or is coupled capacitively thereto by means of a thin intermediate insulating layer (not shown).

Figure 2:
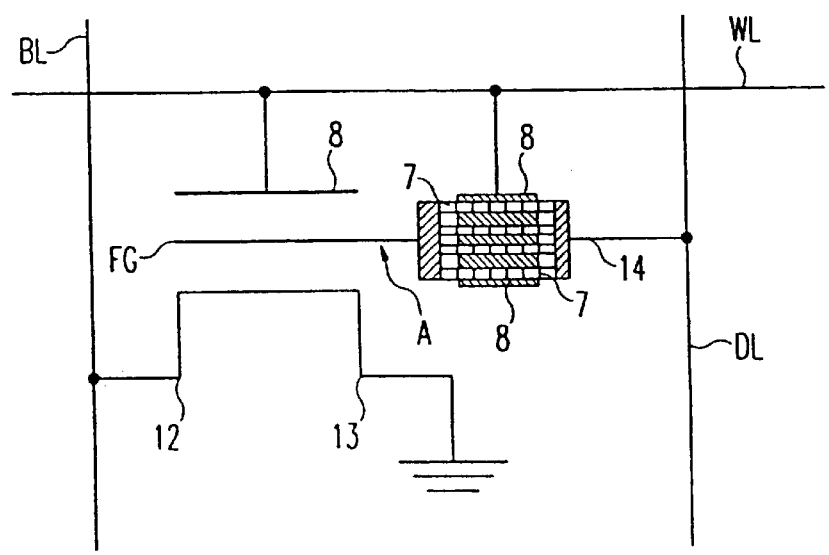
FIG. 2 shows an equivalent circuit diagram of a semiconductor memory cell having a floating gate electrode.

FIG. 2 shows an equivalent circuit diagram of the memory cell with the floating gate electrode FG described in the paragraph above. The metal source contact region 12 is connected to a bit line BL. The drain contact area 13 is at ground potential. The control gate electrode 8 is connected to a word line WL. Since it is situated directly above the floating gate electrode FG (not shown in FIG. 1) and also penetrates the column structure group 7, it first controls the floating gate electrode FG directly (which is illustrated by the direct capacitive coupling between the floating gate electrode FG and the electrode 8) and secondly alters the potential in the entire area of the column structure group 7. The column structure group 7 is connected to a data line DL via the data line contact 14.

By suitably driving the word line WL, the floating gate electrode FG can be connected to the data line DL and can have its charge reversed. The extremely effective potential punch-through of the control gate electrode 8 through the column structure group (storage node) allows the charge transfer along the column structures 7 to be controlled extremely sensitively, which results in a considerable improvement in the ratio of storage time (longer than ten years) to writing time (in the region of nanoseconds).

If the floating gate electrode FG is capacitively coupled to the storage node, the equivalent circuit diagram has a capacitor at location A. If no floating gate electrode FG is provided, in line with the illustration in FIG. 1, the storage node is coupled directly to the channel region of the transistor component 2, 3, 4 by the ends 10' of the column structures 7.

FIGS. 3A–F illustrate the way in which the memory cell shown in FIG. 1 is fabricated.

A LOCOS technique (LOCOS: Local Oxidation of Silicon) is used to produce oxide structures 20, between which there is an active region 21 in line with FIG. 3A. In addition, the source region 2 and the drain region 3 are formed in the normal way. The oxide structures 20 are used for insulation from adjacent memory cells. As an alternative to the LOCOS technique, the trench insulating technique (STI: Shallow Trench Isolation) may also be used for electrically insulating adjacent memory cells.

In a subsequent step, a layer stack including alternate $Si_3N_4$ layers 22 and Si layers 23 is constructed. The $Si_3N_4$ layers 22 can be produced by a heat-treatment step at approximately 900–1000° C. in an $NH_3$ atmosphere.

Next, a top insulating layer 24 is deposited over the layer stack 22, 23 and the surrounding oxide structures 20. The top insulating layer 24, which is approximately 20 nm thick, can, for example, be an $SiO_2$ layer and can be deposited using the known TEOS (TetraEthylOrthoSilicate) method. The top insulating layer 24 is later used as a hard mask for forming the column structures 7.

A first option for producing a random mask is to deposit randomly distributed mask structures in the form of seeds 25 on the surface of the top insulating layer 24. These seeds are formed during a vapor-phase deposition in an epitaxial installation. The process gas used can be an atmosphere including $H_2$ and $SiH_4$ to which $GeH_4$ is admixed in order to slow down the seed-formation process. The partial pressure of $SiH_4$ and $GeH_4$ is in the region of $10^{-3}$ to 1 mbar, and the partial pressure of $H_2$ can be approximately 1 to 100 mbar. Deposition is performed in a temperature range between 500–700° C. Under these process conditions, single silicon seeds determining the distribution and density of the randomly distributed mask structures form on the surface of the top insulating layer 24. As soon as the density of the silicon seeds 25 has reached a prescribed value, for example, approximately $10^{10}$–$10^{12}$/cm2, the seed-formation process is terminated.

The process conditions are then altered in order to set the size of the silicon seeds 25 in a specific manner. To this end, the process conditions are prescribed such as those that are used for selective epitaxy. Further seed formation at the surface of the top insulating layer 24 is then prevented. The selective epitaxy is effected, for example, using a gas mixture including $H_2$ and $SiH_2Cl_2$ in a temperature range between 600–800° C. This gas mixture may have $GeH_4$ added to it in order to set the material composition of the seeds.

Figure 3A:
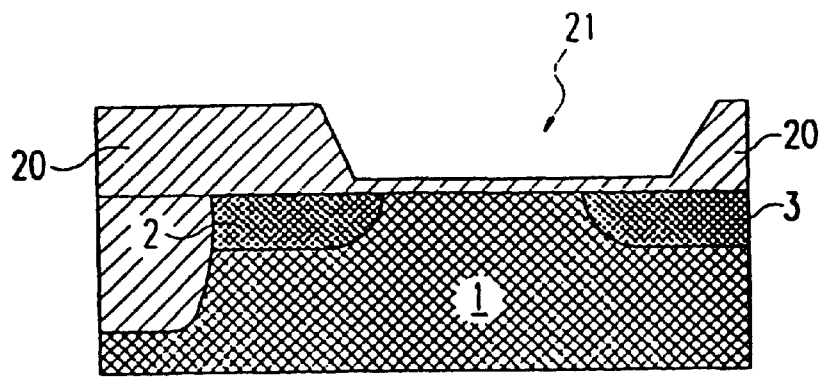
FIGS. 3A–F are sectional illustrations showing how a random mask can be used for fabricating an inventive nonvolatile semiconductor memory cell.
Figure 3B:
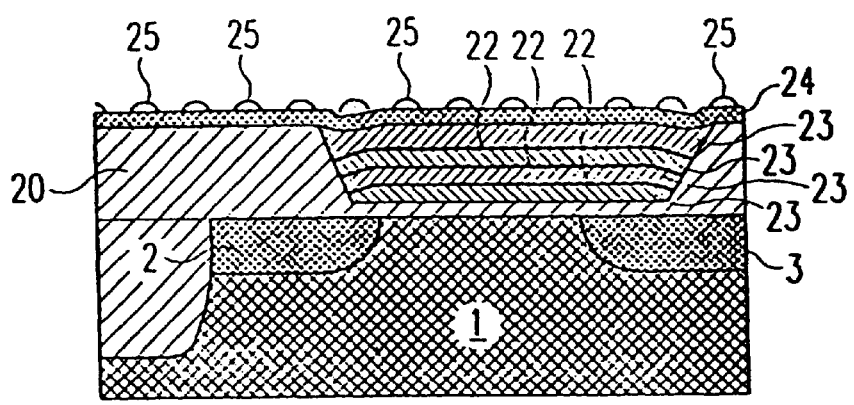

As soon as the diameter of the seeds has reached a desired prescribed value (diameter of the column structures 7), the deposition process is terminated. The seeds 25 form randomly distributed mask structures for a random mask as shown in FIG. 3B.

A random mask can be produced in other ways. A second option is to apply a continuous germanium layer to the top insulating layer 24. The germanium layer decomposes in a subsequent heat-treatment step (e.g. at 500° C.) into individual germanium seeds that form the randomly distributed mask structures.

A third option is to apply a layer having an intentionally rough surface to the top insulating layer 24. The layer may include polysilicon or polygermanium, for example. With a mean thickness of, for example, 50 nm, variations in thickness of 30 nm may be produced. An anisotropic etching process is then used to produce randomly distributed mask structures by exposing the surface of the top insulating layer 24 more readily at places where the thickness of the layer, with a rough surface, is relatively smaller than at places where the layer thickness is greater.

A fourth method option for producing a random mask includes applying a first silicon layer having a thickness of, for example, 20 nm, to the top insulating layer 24. An $SiO_2$ layer having a thickness of, for example, 3 nm, is then applied above the first silicon layer. A second silicon layer having a layer thickness of approximately 20 nm is then applied above the $SiO_2$ layer. In a heat-treatment step at approximately 1000° C., the $SiO_2$ layer embedded between the silicon layers decomposes and forms individual $SiO_2$ islands which, after the top silicon layer has been removed (and the bottom silicon layer has been structured in the process), can be used as randomly distributed mask structures.

Figure 3C:
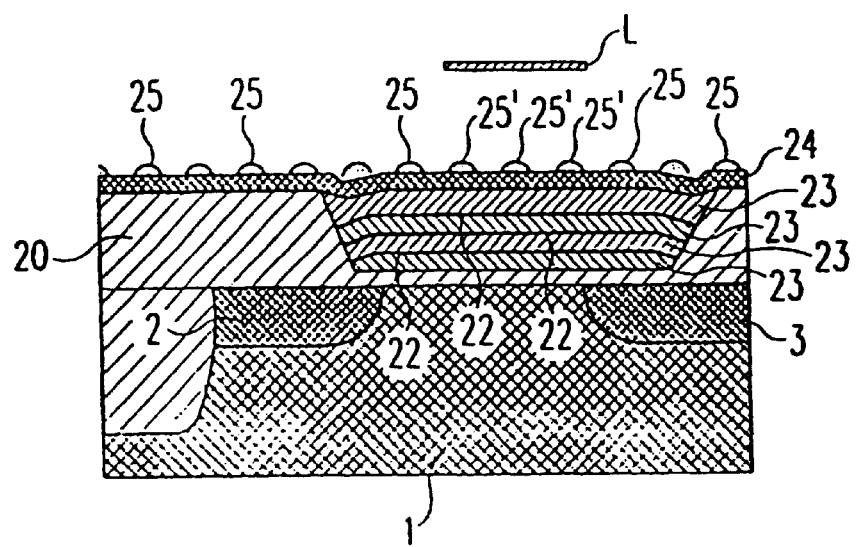
Figure 3D:
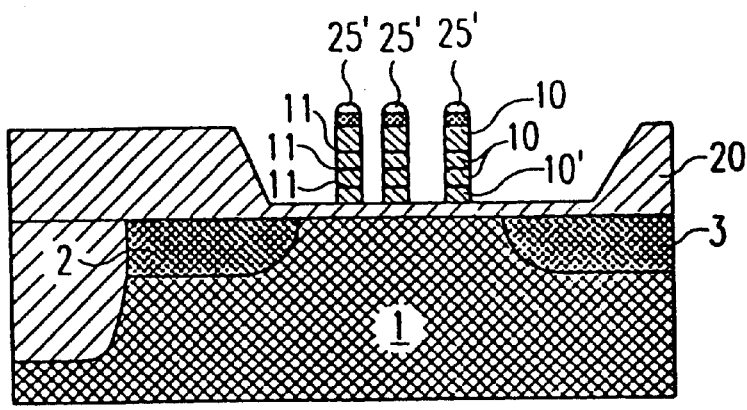

In accordance with FIG. 3C, after the random mask has been formed, a mask L is used to cover an area above the channel region of the transistor component. Unmasked seeds 25 are removed in a subsequent etching step, while seeds 25' which are under the mask L remain.

The number of the remaining seeds 25' is dependent on the seed-formation step carried out previously and may be 200 to 300, for example.

In a subsequent process step (FIG. 3D), the top insulating layer 24 is first removed by anisotropic etching. In this context, the random mask including seeds 25' is transferred to the top insulating layer 24 and forms a hard mask there.

Next, the layer stack 22, 23 is etched using the seeds 25' or the hard mask. In this operation, the column structures 7 are formed from the layer stack 22, 23.

Figure 3E:
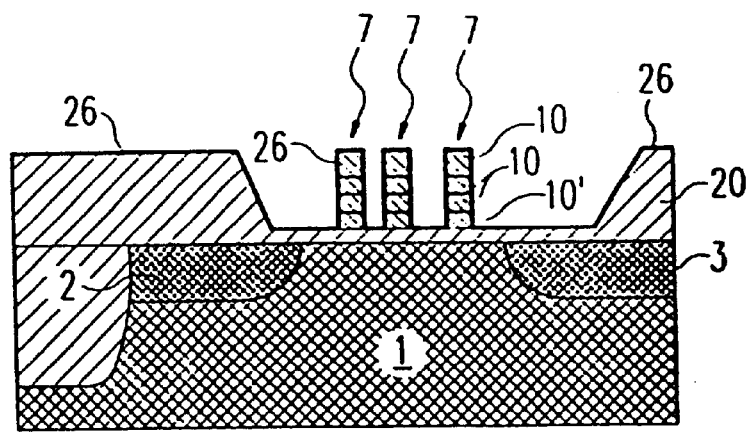

The rest of the seeds 25' and the hard mask are then removed, and a thin insulating layer 26 is produced on the exposed wall areas of the column structures 7 and in the surrounding areas (FIG. 3E). The insulating layer 26 may include a thermal $SiO_2$ layer which is 3 to 5 nm thick and is grown at approximately 700–800° C. The insulating layer 26 is used for electrically insulating the column structures 7 from the control gate electrode 8.

Figure 3F:
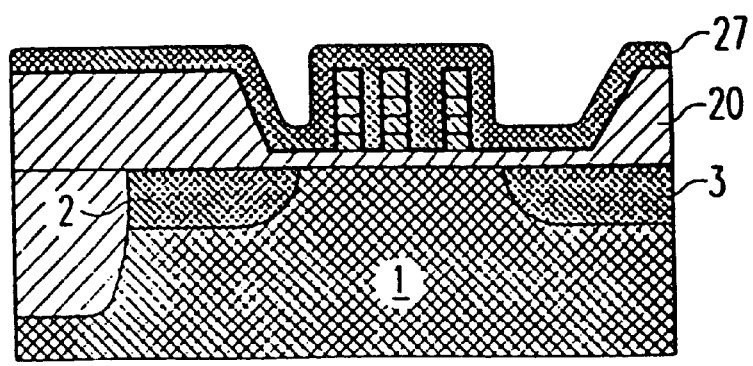

The control gate electrode 8 is formed by depositing a polysilicon layer 27 doped in situ. As FIG. 3F shows, the polysilicon layer 27 fills the open areas which were present, up until then, between the column structures 7, and thus causes the storage node to be penetrated by the control gate electrode 8.

In further steps (not illustrated in more detail), the polysilicon layer 27 is suitably structured and back-etched, so that surface areas on the covered side of the column structures 7 are exposed. Finally, contact is made with the transistor component and the storage node by forming the metal source contact area 12 and the metal drain contact area 13 and the data line contact 14.

Figure 4A:
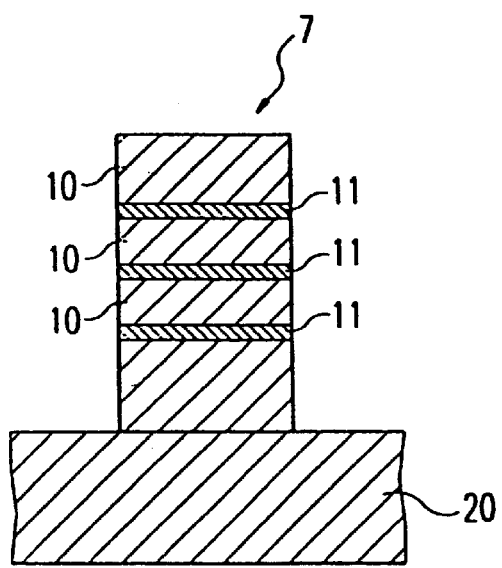
FIG. 4A is a sectional illustration showing an individual column structure.
Figure 4B:
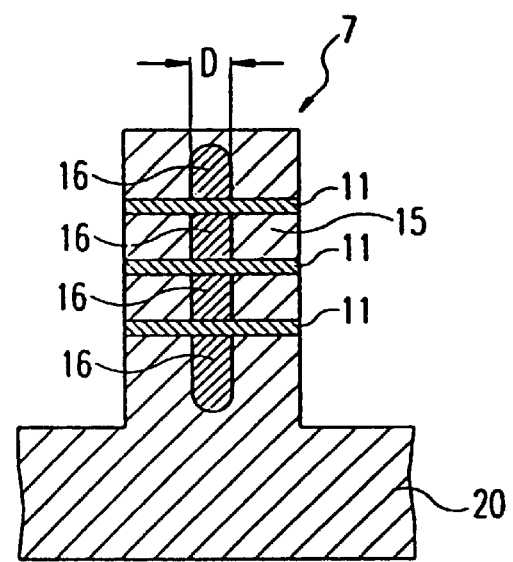
FIG. 4B is a sectional illustration showing an individual column structure after a lateral, self-limiting oxidation step has been carried out.

The modification described below with reference to FIGS. 4A and 4B means that the inventive method also enables, as already mentioned, column structures 7 to be fabricated with single-electron transfers between adjacent semiconductor layer zones 11 made of silicon. The column structure shown in FIG. 4A is obtained by the process sequence explained with reference to FIGS. 3A–D. The insulating layer zones 11 are made, for example, from $Si_3N_4$ and preferably have a small layer thickness of approximately 1–2 nm. The diameter of the column structure 7 has the values already specified (for example 100 nm).

In a subsequent lateral, self-limiting oxidation step, the column structure 7 is oxidized in an outer area 15 using a dry oxidation process at temperatures in the range of 800 to approximately 1000° C. over a period of approximately half an hour. A self-limiting effect, which can possibly he attributed to the occurrence of lattice distortion, which inhibits the diffusion of oxygen, in the central column region, means that central silicon cores 16 remain in the silicon layer zones 11. The silicon cores 16 have a diameter D of only approximately 2 nm as illustrated in FIG. 4B. As only they are suitable for transferring the charge, charge transfer areas with extremely small vertical and lateral dimensions (even the layer thickness of the silicon layer zones 11 can be only approximately 2 nm) are produced in this way. This creates a single-electron component that can be operated at room temperature, with the charge transfer of single electrons being controlled by the potential of the gate electrode 8. The rest of the process sequence for constructing the semiconductor memory cell takes place in accordance with the description relating to FIG. 3F.

We claim:

1. A nonvolatile semiconductor memory cell, comprising:
   a substrate;
   a transistor component formed on said substrate, said transistor component having a switching state;

a control gate electrode; and a storage node that determines the switching state of said transistor component, said storage node located near said control gate electrode;

said storage node including a group of a plurality of vertically oriented column structures;

each one of said plurality of said vertically oriented column structures having at least two semiconductor layer zones and an insulating layer zone configured between said two semiconductor layer zones.

2. The nonvolatile semiconductor memory cell according to claim 1, wherein:

said transistor component includes a channel region; and said plurality of said vertically oriented column structures are randomly distributed above said channel region.

3. The nonvolatile semiconductor memory cell according to claim 1, comprising:

a plurality of insulating layer zones;

said at least two semiconductor layer zones defining a plurality of semiconductor layer zones;

said insulating layer zone forming one of said plurality of said insulating layer zones; and said plurality of semiconductor layer zones and said plurality of said insulating layer zones being alternately configured.

4. The nonvolatile semiconductor memory cell according to claim 1, wherein said control gate electrode at least partly surrounds each one of said plurality of said vertically oriented column structures of said storage node.

5. The nonvolatile semiconductor memory cell according to claim 1, wherein:

said transistor component has a floating gate electrode; and said storage node is capacitively coupled to said floating gate electrode.

6. The nonvolatile semiconductor memory cell according to claim 1, comprising:

an electrically conductive connection;

said transistor component having a floating gate electrode; and said storage node coupled to said floating gate electrode by said electrically conductive connection.

7. The nonvolatile semiconductor memory cell according to claim 1, wherein said storage node forms a gate electrode of said transistor component.

8. The nonvolatile semiconductor memory cell according to claim 1, wherein each one of said plurality of said vertically oriented column structures have a diameter of less than 50 nm.

9. The nonvolatile semiconductor memory cell according to claim 1, wherein each one of said plurality of said vertically oriented column structures have a diameter of less than 30 nm.

10. The nonvolatile semiconductor memory cell according to claim 1, wherein said two semiconductor layer zones have an axial thickness of less than 10 nm.

11. The nonvolatile semiconductor memory cell according to claim 1, wherein said two semiconductor layer zones have an axial thickness of less than 3 nm.

12. The nonvolatile semiconductor memory cell according to claim 1, wherein:

said control gate electrode has a peripheral region; and said peripheral region entirely surrounds said group of said plurality of vertically oriented column structures.

* * * * *